(12) United States Patent
Oka et al.

(10) Patent No.: US 9,842,970 B2
(45) Date of Patent: Dec. 12, 2017

(54) LIGHT EMITTING DEVICE

(71) Applicant: NICHIA CORPORATION, Anan-shi, Tokushima (JP)

(72) Inventors: Yuta Oka, Tokushima (JP); Hiroto Tamaki, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 15/257,994

(22) Filed: Sep. 7, 2016

(65) Prior Publication Data

US 2017/0069801 A1    Mar. 9, 2017

(30) Foreign Application Priority Data

Sep. 8, 2015  (JP) .................................. 2015-177089

(51) Int. Cl.

| H01L 33/62 | (2010.01) |
|---|---|
| H01L 33/48 | (2010.01) |
| H01L 33/60 | (2010.01) |
| H01L 33/54 | (2010.01) |
| H01L 33/50 | (2010.01) |

(52) U.S. Cl.
CPC ............ *H01L 33/486* (2013.01); *H01L 33/60* (2013.01); *H01L 33/502* (2013.01); *H01L 33/54* (2013.01)

(58) Field of Classification Search
CPC ..... H01L 33/62; H01L 33/486; H01L 33/502; H01L 33/54; H01L 33/60
See application file for complete search history.

(56) References Cited

U.S. PATENT DOCUMENTS

| 2002/0139990 A1* | 10/2002 | Suehiro ................. F21V 29/004 257/99 |
|---|---|---|
| 2008/0128739 A1* | 6/2008 | Sanpei ................. H05K 1/0203 257/99 |
| 2012/0193665 A1 | 8/2012 | Yamada |
| 2015/0155450 A1* | 6/2015 | Oka ....................... H01L 33/504 257/98 |
| 2015/0188004 A1* | 7/2015 | Ozeki ................... H01L 33/507 257/98 |
| 2015/0188010 A1* | 7/2015 | Kim .................. G02F 1/133605 257/98 |
| 2015/0340546 A1* | 11/2015 | Suzuki ............... H01L 33/0079 438/27 |

(Continued)

FOREIGN PATENT DOCUMENTS

| JP | 2001-077433 A | 3/2001 |
|---|---|---|
| JP | 2009-218274 A | 9/2009 |
| JP | 2010-238846 A | 10/2010 |

(Continued)

*Primary Examiner* — Phuc Dang
(74) *Attorney, Agent, or Firm* — Global IP Counselors, LLP

(57) ABSTRACT

A light emitting device has; a light emitting element, a light reflecting member that is disposed so as to cover the lateral surfaces of the light emitting element and expose a top surface of the light emitting element, a frame that is disposed on the light reflecting member so as to surround an outer periphery of the top surface of the light emitting element, a light transmissive member that is disposed inside the frame, and a sealing member that covers the light reflecting member, the frame and the light transmissive member, and that has a flange covering part of the frame.

19 Claims, 10 Drawing Sheets

(56) References Cited

U.S. PATENT DOCUMENTS

2015/0340569 A1\* 11/2015 Tamaki .................. H01L 33/56
257/98

FOREIGN PATENT DOCUMENTS

| JP | 2010-283281 A | 12/2010 |
|----|---------------|---------|
| JP | 2012-015319 A | 1/2012 |
| JP | 2012-156442 A | 8/2012 |
| JP | 2014-212248 A | 11/2014 |
| JP | 2015-109333 A | 6/2015 |

\* cited by examiner

LIGHT EMITTING DEVICE

CROSS-REFERENCE TO RELATED APPLICATIONS

This application claims priority to Japanese Patent Application No. 2015-177089 filed on Sep. 8, 2015. The entire disclosure of Japanese Patent Application No. 2015-177089 is hereby incorporated herein by reference.

BACKGROUND

1. Technical Field

The present disclosure relates to a light emitting device.

2. Description of Related Art

There is a known light emitting device in which light extraction efficiency is improved by forming a lens above the light emitting element. For example, with the light emitting device discussed in JP2012-156442A, as shown in FIG. 4, a light emitting portion surrounded by a frame is made smaller with respect to the lens diameter, which allows the angle of incidence of the light beam emitted at the interface between the lens and an air layer to be smaller, and attempt to increase the light extraction efficiency.

The equipment in which light emitting devices are installed have tended to be more downsized in recent years, and there is a need for further reduction in the size of light emitting devices to be installed. It is an object of the present disclosure to provide a light emitting device that can be made more compact.

SUMMARY

A light emitting device of the present disclosure has; a light emitting element, a light reflecting member that is disposed so as to cover the lateral surfaces of the light emitting element and expose a top surface of the light emitting element, a frame that is disposed on the light reflecting member so as to surround an outer periphery of the top surface of the light emitting element, a light transmissive member that light transmissive and is disposed inside the frame, and a sealing member that covers the light reflecting member, the frame and the light transmissive member, and that has a flange covering part of the frame.

Disclosed herein is a light emitting device, wherein it is possible to provide a light emitting device that can be made more compact.

DETAILED DESCRIPTION

In the following description, terms will be used to indicate particular directions or positions as needed (such as "upper," "lower," "left," "right," and other terms that include these). The use of these terms is intended to facilitate an understanding of the invention through reference to the drawings, and the technological scope of the present invention is not limited by the meanings of these terms. Numbers that are the same in two or more drawings refer to the same portion or member. A number of embodiments will be described in order to facilitate an understanding of the invention, but these embodiments are not mutually exclusive, and parts that can be shared will apply to the description of other embodiments.

Embodiment 1

Figure 1:
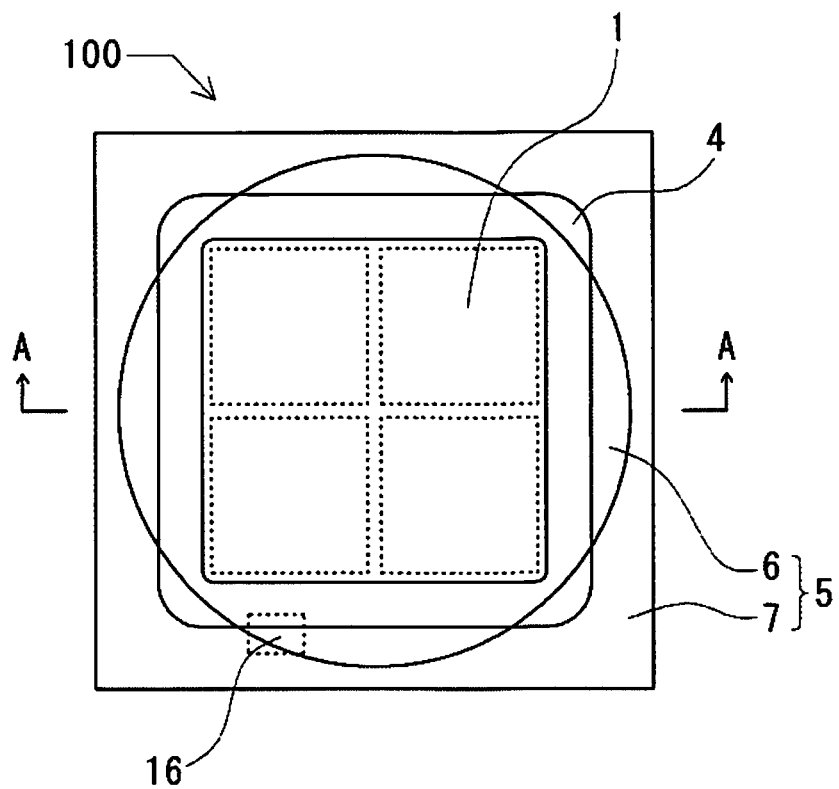
FIG. 1 is a schematic top view of the light emitting device in Embodiment 1.
Figure 2:
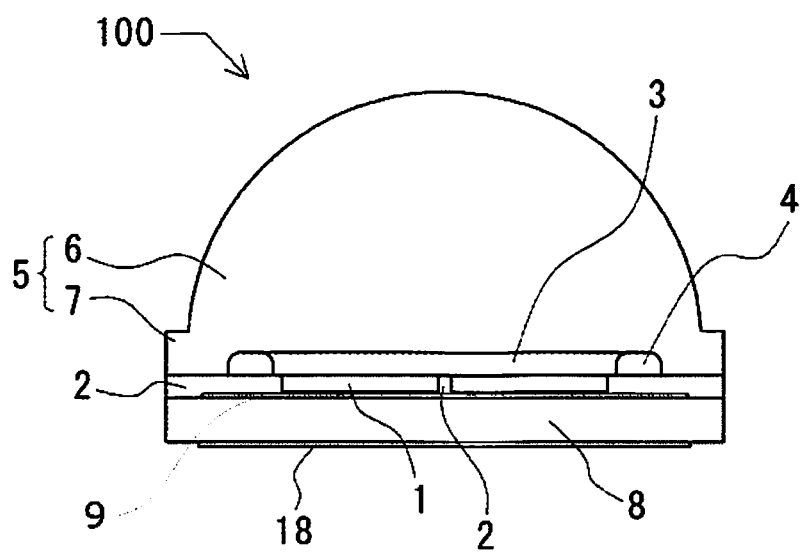
FIG. 2 is a schematic cross sectional view along the A-A' line in FIG. 1.
Figure 3:
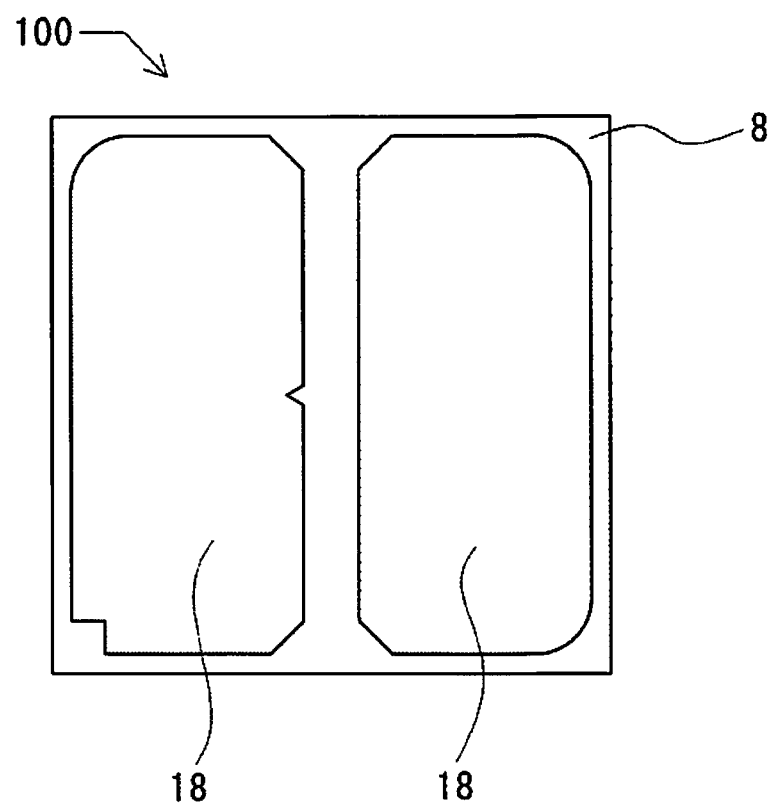
FIG. 3 is a schematic lower view of the light emitting device in Embodiment 1.

FIG. 1 is a schematic top view of the light emitting device 100 in Embodiment 1, FIG. 2 is a schematic cross sectional view along the A-A line in FIG. 1 and FIG. 3 is a schematic lower view of the light emitting device in Embodiment 1.

The light emitting device in this embodiment includes: a light emitting element 1 having a top surface which serves as a light emitting face, and having a lower surface (i.e., opposite side from the light emitting face on which electrodes are provided; a light reflecting member 2 that is disposed so as to cover the lateral surfaces of the light emitting element 1 and expose the top surface of the light emitting element 1; and a frame 4 that is formed on the light reflecting member 2, so as to surround the outer periphery of the top surface of the light emitting element 1. The light emitting device 100 further has a light transmissive member 3 that is disposed inside the frame 4, in other words, the light transmissive member 3 that fills the area surrounded by the frame 4, and a sealing member 5 that covers the light reflecting member 2, the frame 4, and the light transmissive member 3.

With the light emitting device 100 in Embodiment 1, the light emitting element 1 has a structure that, for example, a semiconductor layer is stacked on a light transmissive insulating mounting board, and at least one pair of positive and negative electrodes is formed on one surface on the semiconductor layer side. The light reflecting member 2 is provided so as to cover at least the lateral surfaces of the light emitting element 1.

The light emitting element 1 in this embodiment is flip-chip mounted with a bump or other such bonding material on a mounting board 8, and its lateral surfaces are in contact with and covered by the light reflecting member 2 as shown in FIG. 2. Wiring 9 is provided on the top surface of the mounting board 8, and wiring 9 is joined to the electrodes of the light emitting element 1 via a joining member. A shape in plan view of the light emitting element 1 is substantially square, and four pieces of the light emitting elements are arranged in a 2×2 array (i.e., lattice shape) as shown in FIG. 1.

The spacing between the adjacent light emitting elements is preferably less than the length of one side of the light emitting elements. In particular, using a spacing in a range of 1 to 300 μm, and preferably in a range of 50 to 100 μm, allows a phosphor or a light diffusing material to be used to diffuse light in the non-light-emission area between the light emitting elements. Therefore, the light reflecting member 2 is preferably disposed in between the adjacent light emitting elements.

The light reflecting member 2 preferably covers all of the lateral surfaces, excluding the top surface of the light emitting element 1. This is for the purpose of reducing light to be absorbed between light emitting elements. Also, a top surface of the light reflecting member is preferably flat. This top surface may be substantially flush with the top surfaces of the light emitting elements, or may be positioned higher than the top surfaces of the light emitting elements. The term "flush" here means that it is permitted for a slight, unintentional concave part formed on the surface due to the weight of the resin itself, in other words, it is permitted for there to be a difference of about a few dozen microns in the height. Furthermore, the light reflecting member 2 may embed components other than the light emitting element 1 (such as the protective element 16 shown in FIG. 1), mounted on the mounting board 8. At least one pair of terminal electrodes 18 is provided on the lower surface of the mounting board 8 as shown in FIG. 3. The shapes of these two terminal electrodes 18 may be made somewhat different from each other, for example, by using a cutoff or the like, thereby making an anode mark or a cathode mark to show the polarity.

The frame 4 is formed on the top surface of the light reflecting member 2. The frame 4 surrounds the outer periphery of the top surface of the light emitting elements 1. As shown in FIG. 1, when a plurality of light emitting elements 1 are used, the frame 4 is disposed so as to surround the outermost periphery of these light emitting elements 1. Preferably, the frame 4 is formed so that all of the top surfaces of the light emitting elements 1 are exposed within the frame 4. For instance, it is preferable the frame 4 is disposed on a position somewhat outside the top surfaces of the light emitting elements 1 located the farthest to the outside, and the top surface of the light reflecting member 2 is exposed on the outermost side within the frame 4. The distance between the outer edges of the light emitting elements 1 and the inner walls of the frame 4 is, for example, 300 μm or less, and preferably in a range about 0 μm to 100 μm. Thus limiting the light emission region allows the light emitting device to exhibit higher luminance.

The frame 4 is preferably formed along the outer edges on the top surfaces of the light emitting elements. The frame 4 can be formed from a resin material that is a mixture of substances having light reflective property. The height of the frame 4 is preferably about 50 to 500 μm.

The light transmissive member 3 is disposed within the frame 4, and specifically in the recess surrounded by the frame 4. In this embodiment, the recess has a bottom surface formed by the top surfaces of the light emitting elements 1 and the top surface of the light reflecting member 2, and an inner surface formed by the frame 4. The light transmissive member 3 is disposed within the recess.

For the light transmissive member 3, a material in which a phosphor or other such wavelength conversion substance is contained in a resin material, is preferably used. The light transmissive member 3 can be formed by dropping (i.e., potting) the resin material into the frame 4. In the case where a phosphor is used, the phosphor is preferably in contact with the top surface of the light emitting element 1 in order for heat generated from the phosphor during wavelength conversion to be dissipated efficiently, and thus the phosphor is preferably disposed on the bottom surface of the recess, in other words, allowed to settle on the light emitting element side.

Figure 4:
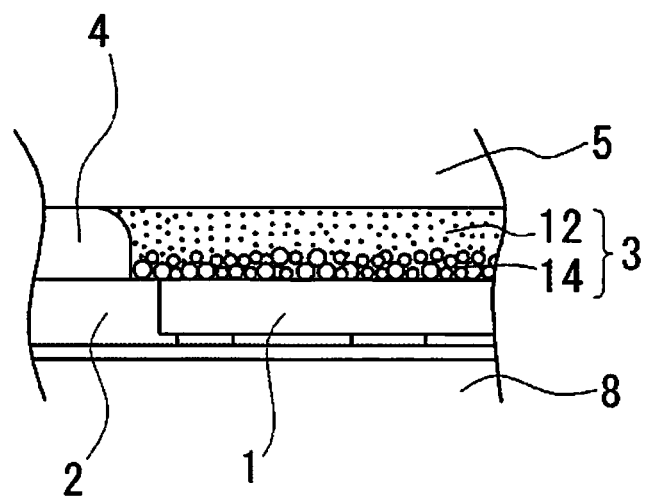
FIG. 4 is a partially enlarged view of FIG. 2.

FIG. 4 is a detail view of the area near the light emitting element 1 in FIG. 2. As shown in FIG. 4, inside the frame 4, the light transmissive member 3 preferably has a two-layer structure consisting of a phosphor layer 14 and a diffusion layer 12. Such two-layer structure can be formed by dropping the resin material containing the light diffusing material and a phosphor with a higher specific gravity than this light diffusing material into the frame 4, and allowing the phosphor to settle. The light diffusing material with a lower specific gravity is dispersed above the phosphor. The settling may be forced settling by, for example, centrifugal settling, or may be natural settling. By using the light diffusing material, the dark parts between adjacent light emitting elements may be less recognizable, and quality of light can be improved by making the light emitting device as if being a point light source.

The sealing member 5 is light transmissive, which is provided in order for light from the light emitting elements (i.e., light emitted through the light transmissive member 3) to be extracted more efficiently. The sealing member 5 covers the light reflecting member 2, the frame 4, and the light transmissive member 3. The sealing member 5 also has lens component 6 and a flange 7 that sticks out to the outer peripheral side of the lens, below the lens component 6.

As shown in FIG. 1, part of the frame 4 is covered by the flange 7. In order to increase light extraction efficiency, the lens component 6 is preferably large enough that not all of the light emitted from the light emitting elements will be reflected at the interface of the lens component. However, there is a limit to increase the lens size while still attempting to downsize the light emitting device. In view of this, part of the frame 4 shall be covered by the flange 7. In other words, part of the frame 4 is disposed straddling the lens component 6 and the flange 7 in plan view. More preferably, as shown in FIG. 1, part of the outer edge of the frame 4 is covered by the flange 7, whereas the inner surface of the frame 4, that is, the outer edge of the light transmissive member 3, is entirely disposed under the lens component 6. This the light emitting device to be downsized without reduction in the light extraction efficiency as much as possible.

Also, it is preferable for the end faces of the sealing member 5 and the mounting board 8 to be flush so that the outer edge of the sealing member 5 and the outer edge of the mounting board 8 will match up in top view.

Method for Manufacturing Light Emitting Device of Embodiment 1

The method for manufacturing the light emitting device of Embodiment 1 is the method for manufacturing the above-mentioned light emitting device 100, which includes a light emitting element mounting step, a light reflective member formation step, a frame formation step and light transmissive member formation step, as shown in FIGS. 5A to 10B.

Mounting of Light Emitting Element

Figure 5A:
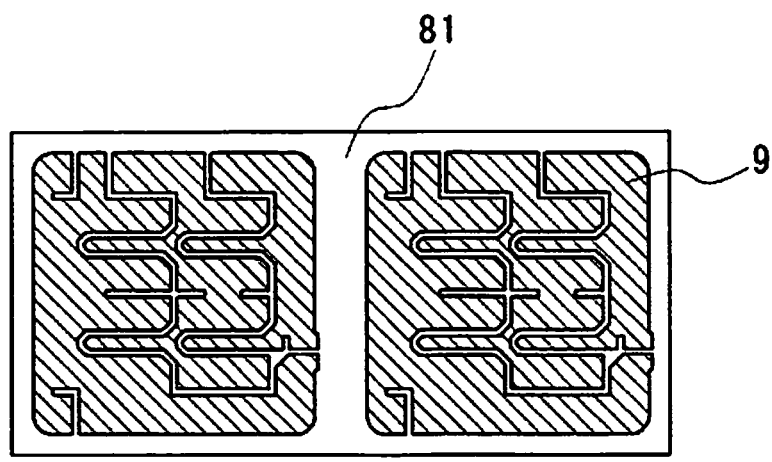
FIG. 5A is a schematic top view and FIG. 5B is a schematic lateral side view, respectively showing a method for manufacturing the light emitting device in Embodiment 1.
Figure 5B:
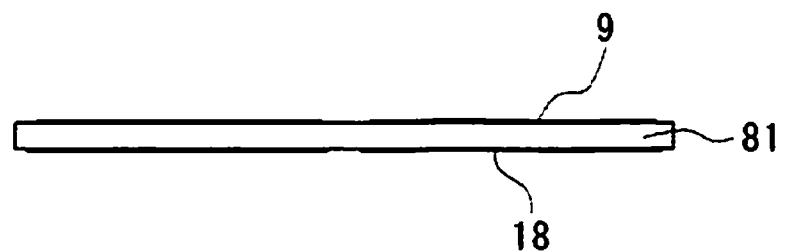

In mounting process of the light emitting element, a mounting board 81 is provided, and light emitting elements 1 are mounted on the mounting board 81 as shown in FIGS. 5A and 5B each illustrating a schematic top view and a schematic side view. The mounting board 81 is in the form of a board, with wiring 9 formed on the top surface and metal members serving as terminal electrodes 18 formed on the lower surface. The wiring 9 and the terminal electrodes 18 are electrically connected by vias or the like inside the mounting board.

Figure 6A:
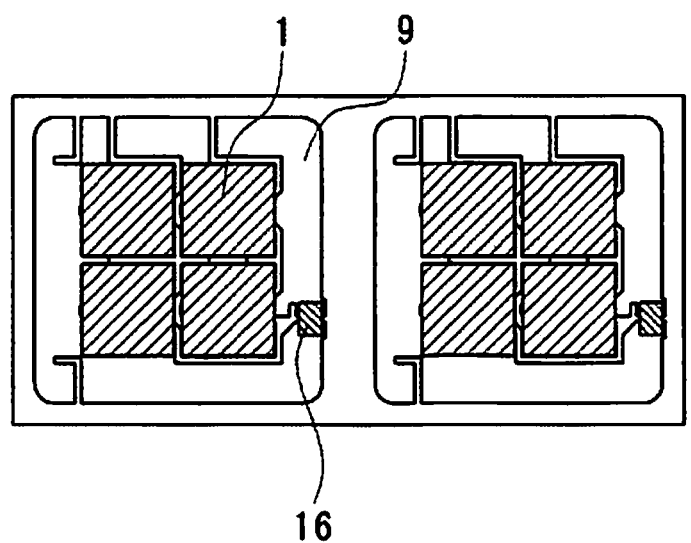
FIG. 6A is a schematic top view and FIG. 6B is a schematic lateral side view, respectively showing a method for manufacturing the light emitting device in Embodiment 1.
Figure 6B:
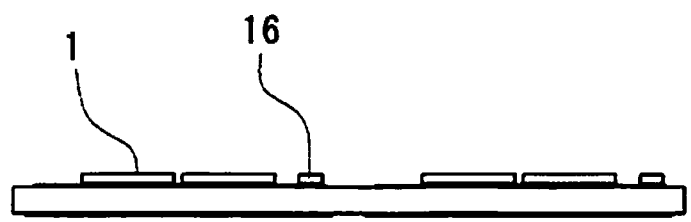

Then, the light emitting elements 1 are flip-chip mounted on the top surface of the mounting board 81 via bonding members as shown in FIGS. 6A and 6B, which each show a schematic top view and a schematic side view, respectively. The connection between the light emitting elements 1 and the wiring 9 of the mounting board 81 can be made using bumps, solder, conductive paste, anisotropic conductive paste, or another such bonding member. The protective element 16 may be mounted either before or after the mounting of the light emitting elements 1. Usually, the mounting board 81 is an assembly in which a plurality of mounting boards 8 are continued, until being divided in a subsequent step. The description here will make use of a drawing in which two mounting boards 8 are linked.

After the light emitting elements 1 are mounted on the mounting board, the spaces between the top surface of the mounting board and the lower surfaces of the light emitting elements 1 may optionally be under-filled to lessen the stress with the light reflecting member 2. By forming under-fill, the light reflecting member 2 less likely to enter the spaces between the top surface of the mounting board and the lower surfaces of the light emitting elements, and therefore increases reliability. This is because when the light reflecting member 2 enter into the lower surfaces of the light emitting elements 1, there is the risk that the light reflecting member 2 will expand by heat and lift up the light emitting elements 1. Providing the under-fill is also preferable because it can have a light reflecting function, allowing the light emitted toward the mounting board 8 to be reflected.

The arrangement of the light emitting elements 1 can be suitably determined according to the size of the light emitting elements being used, and the specifications of the light emitting device ultimately to be obtained. For example, they can be arranged in a array, with the top surfaces of a plurality of light emitting elements forming a single light emitting region.

Formation of Light Reflecting Member

Figure 7A:
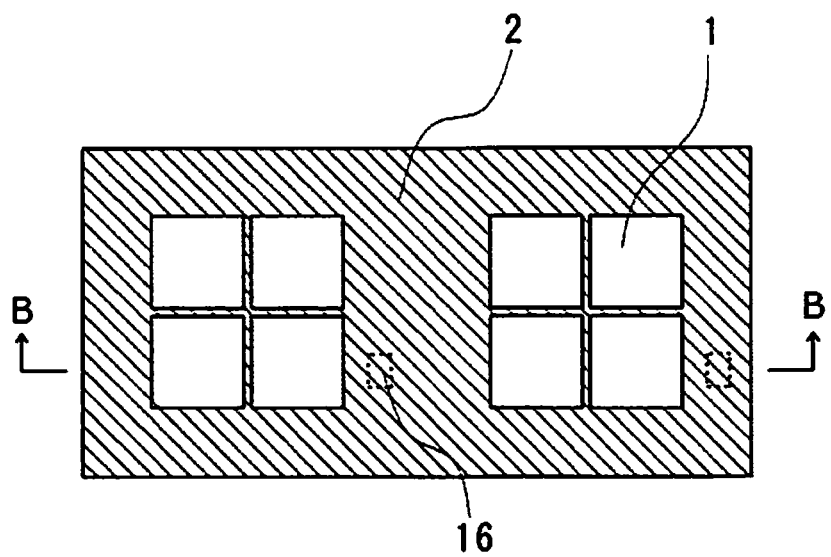
FIG. 7A is a schematic top view and FIG. 7B is a schematic cross sectional view along the B-B' line in FIG. 7A, respectively showing a method for manufacturing the light emitting device in Embodiment 1.
Figure 7B:
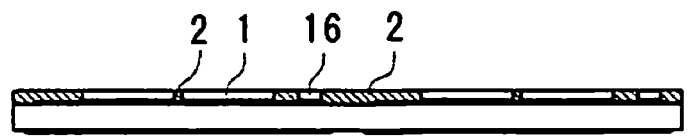

FIGS. 7A and 7B show a schematic top view and a schematic cross sectional view along the B-B' line in FIG. 7A, respectively illustrating that the lateral surfaces of the light emitting elements 1 are covered by the light reflecting member 2 so that the top surfaces of the light emitting elements 1 are exposed. Preferably, the top surface of the protective element 16 is positioned lower than the top surfaces of the light emitting elements 1, and top surface of the protective element 16 is covered by the light reflecting member 2. Accordingly, light absorption by the protective element 16 may be reduced. The top surface of the light emitting elements 1 and the top surface of the light reflecting member 2 are preferably at the same height, that is, are substantially flush.

The light reflecting member 2 can be formed by providing a dam material around the outside of the mounting board assembly, and pouring a resin material, which contains a light reflecting member, into this dam. The viscosity and so forth are adjusted so that the spaces between adjacent light emitting elements 1 are properly filled in.

Formation of Frame

Figure 8A:
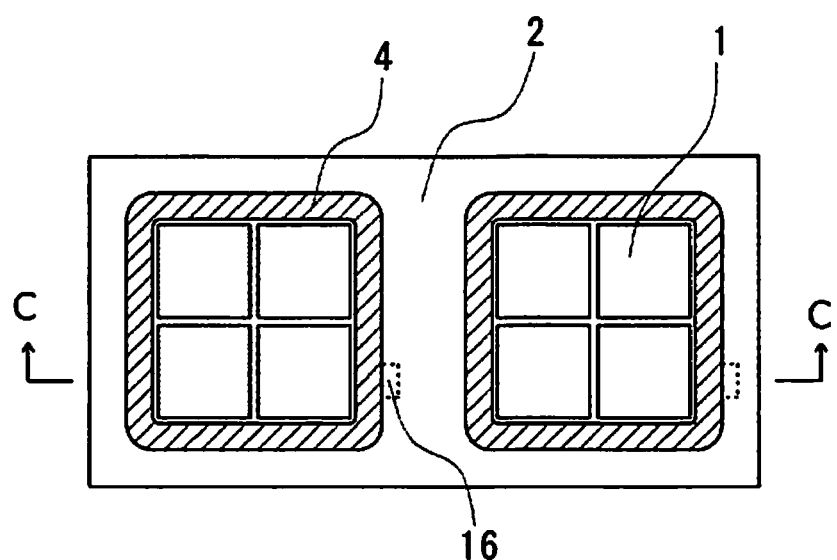
FIG. 8A is a schematic top view and FIG. 8B is a schematic cross sectional view along the C-C' line in FIG. 8A, respectively showing a method for manufacturing the light emitting device in Embodiment 1.
Figure 8B:
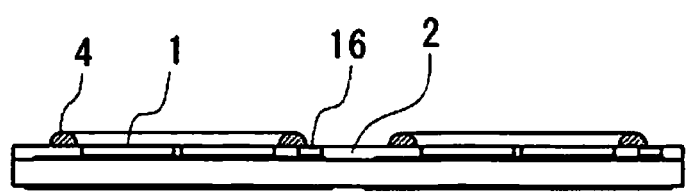

FIGS. 8A and 8B show a schematic top view and a schematic cross sectional view along the C-C' line in FIG. 8A, respectively illustrating that the frame 4 is then formed so as to surround the top surfaces of the light emitting elements 1. The frame 4 can be formed, for example, using a resin discharge apparatus to discharge a circular shape of resin over the light reflecting member 2. Alternatively, the frame that has been molded ahead of time in a metal mold or the like may be transfer-printed and affixed onto the light reflecting member 2, or an inkjet device, a 3D printer, or the like may be used to form the frame 4. In this embodiment, the frame 4 is formed along about the outer 100 μm to the outer edges of the top surfaces of the light emitting elements 1, and in a quadrilateral shape whose corners are rounded in plan view.

Formation of Light transmissive Member

Figure 9A:
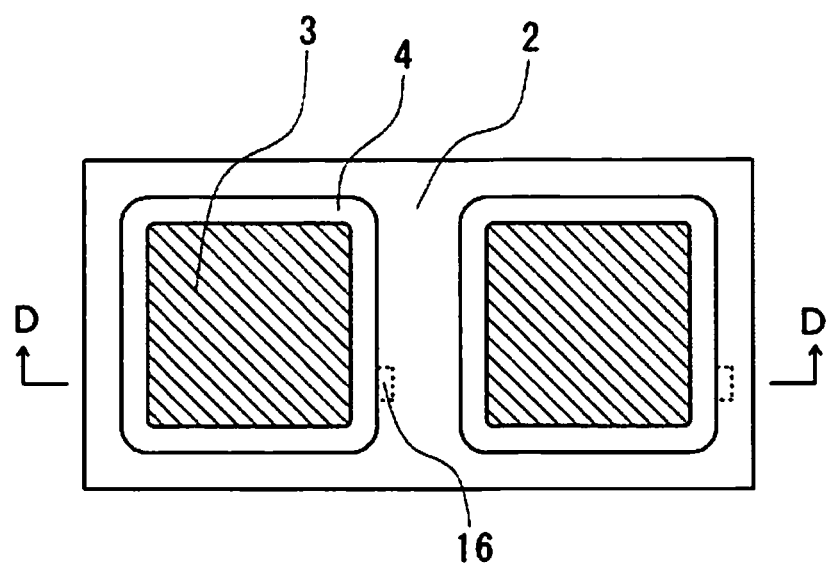
FIG. 9A is a schematic top view and FIG. 9B is a schematic cross sectional view along the D-D' line in FIG. 9, respectively showing a method for manufacturing the light emitting device in Embodiment 1.
Figure 9B:
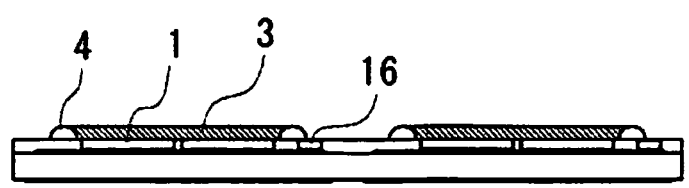

FIGS. 9A and 9B show a schematic top view and a schematic cross sectional view along the D-D' line in FIG. 9, respectively illustrating that the light transmissive member 3 is disposed inside the frame 4. In this embodiment, a resin material which contains a phosphor and a light diffusing material is potted in the region bounded by the frame 4, thereby filling in the frame 4. Thereafter, the phosphor allows to be in contact with the top surfaces of the light-emitting elements 1 due to the natural setting, the phosphor layer 14 is formed near the light emitting elements, and the diffusion layer 12 thereon (see FIG. 4).

Sealing Member Formation Step

Figure 10A:
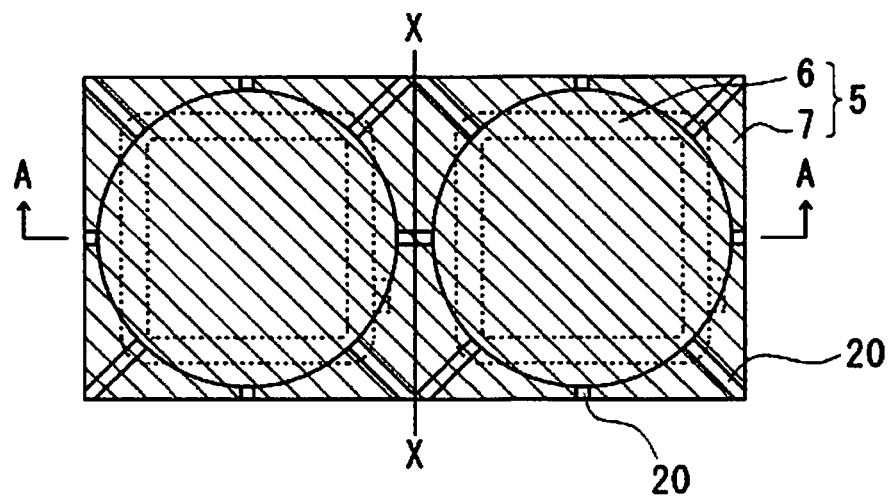
FIG. 10A is a schematic top view and FIG. 10B is a schematic lateral side view, respectively showing a method for manufacturing the light emitting device in Embodiment 1.
Figure 10B:
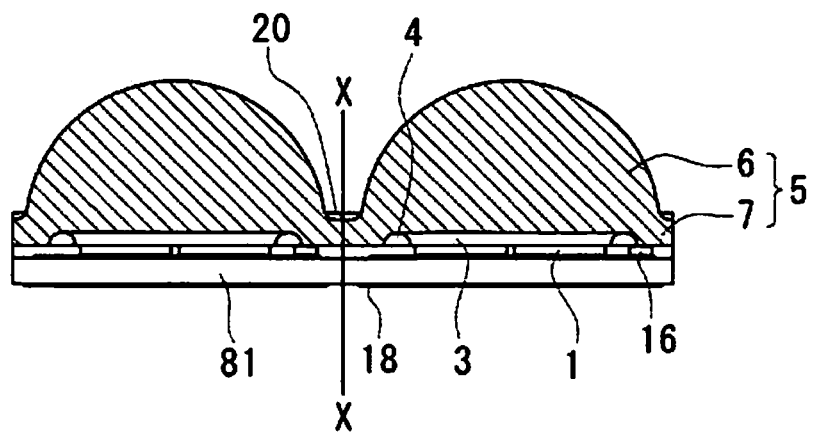

FIGS. 10A and 10B show a schematic top view and a schematic side view, respectively illustrating that the sealing member 5 is formed on the light reflecting member 2, the frame 4, and the light transmissive member 3. To make the description easier to understand, the light reflecting member 2 is shown as see-through so that the light emitting element 1 and the protective element 16 can be seen. The sealing member 5 can be formed by a variety of methods, such as transfer molding, compression molding, coating (i.e., potting) with a resin, and molding with a casting case. The sealing member 5 here is formed so as to have the lens component 6 and the flange 7, and is disposed so that part of the frame 4 is located at the bottom part of the flange 7. In forming the sealing member 5 by compression molding, it is preferable to form an air vent 20 in the flange 7. Accordingly, the lens shape is stabilized.

Separation

Finally, the flange 7 between adjacent lens components 6 (the X-X line in FIGS. 10A and 10B) is cut by dicing or another such method to obtain the light emitting device of Embodiment 1. Consequently, the end surfaces of the mounting board 8, the light reflecting member 2, and the sealing member 5 are flush. The cut surfaces become the outer edges of the light emitting devices, so the yield can be increased.

Figure 11:
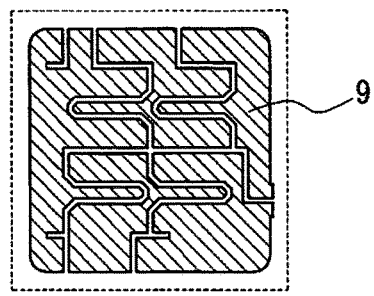
FIG. 11 is a schematic plane view of the wiring in the light emitting device in Embodiment 1.

As shown in FIG. 5, in this embodiment, the circuit placed in the light emitting devices in which the four light emitting elements are respectively mounted have been disposed have the pattern of the wiring 9, which is two in series and two in parallel, but the wiring pattern can be suitably modified to match the desired circuit. FIG. 11 shows an example of the wiring 9 in the case where the four light emitting elements are in serial connection. The number of mounted light emitting elements may also be just one.

Embodiment 2

Figure 12:
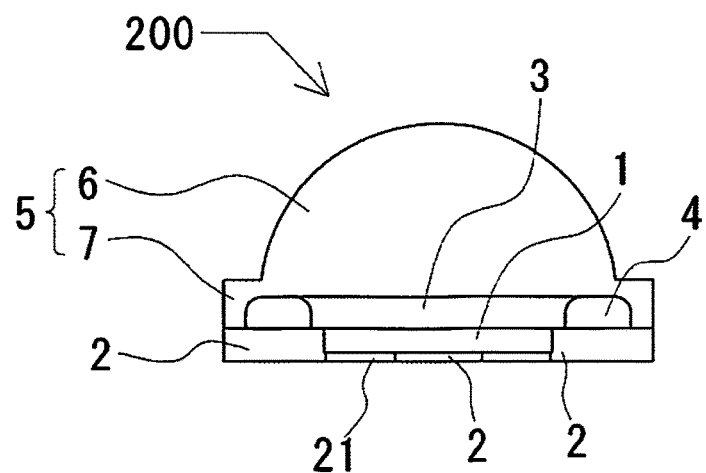
FIG. 12 is a schematic cross sectional view of the light emitting device in Embodiment 2.

As shown in FIG. 12, the light emitting device 200 in Embodiment 2 differs from the light emitting device 100 in Embodiment 1 in that there is no mounting board on which the light emitting element 1 is to be mounted. Because there is no mounting board, electrodes 21 are exposed from the lower surface of the light reflecting member 2.

Because the light emitting device in Embodiment 2 configured as above has no mounting board, it can be thinner and more compact. This downsized light emitting device also allows for higher-density mounting.

Method for Manufacturing Light Emitting Device of Embodiment 2

Figure 13:
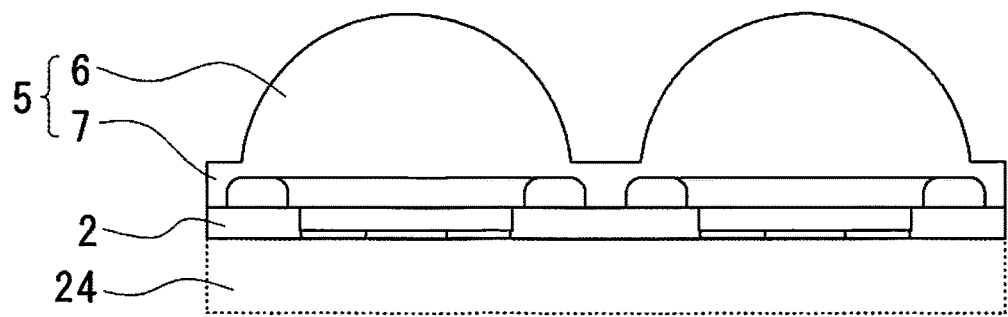
FIG. 13 is a schematic cross sectional view showing a method for manufacturing the light emitting device in Embodiment 2.

As shown in FIG. 13, the method for manufacturing the light emitting device 200 of Embodiment 2 is configured the same as the manufacturing method in Embodiment 1, except that a support member 24 is used instead of the mounting board 8 that is used in the method for manufacturing a light emitting device of Embodiment 1. The light emitting device 200 can be formed by the same manufacturing method as in Embodiment 1, except that the support member 24 is separated off (i.e., removed) as indicated by the dotted line in FIG. 13 after the sealing member 5 is formed.

Embodiment 3

The light emitting device 300 of Embodiment 3 can mainly be used to advantage as a light source for a backlight or the like. It differs from Embodiment 1 in the shape of the sealing member 5.

Figure 14:
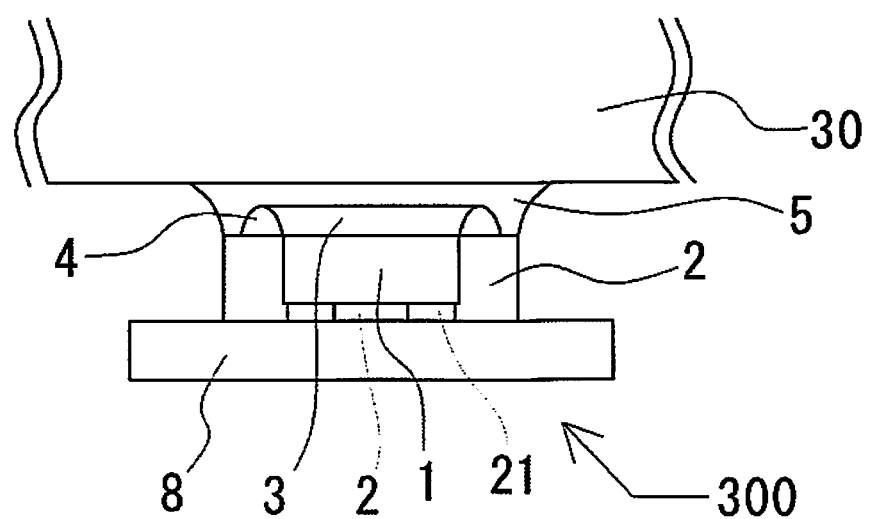
FIG. 14 is a schematic partial enlarged view of the main parts of the light emitting device in Embodiment 3.

FIG. 14 is a cross section of the light emitting device 300 and an optical member 30 provided in contact with the sealing member 5, which shows the cross section in the thickness direction of the optical member. As shown in FIG. 14, the sealing member 5 has a flat surface that can be connected to the optical member 30, such as a light guide plate or a light guide film. In Embodiment 3, the sealing member 5 has a shape that spreads outward toward the top (i.e., the opposite side from the back surface of the mounting board 8). The lateral surfaces of the sealing member 5 are curved. Also, the sealing member 5 is not in contact with the mounting board 8, and covers the top surface of the light reflecting member 2 exposed on the outside of the frame 4, the outer walls of the frame 4, and the top surface of the light transmissive member 3. Accordingly, good quality of light is efficiently incident on the optical member.

In the case where the sealing member 5 is brought into contact with an edge-type light guide plate, the light emitting device is preferably a thin type. "Thin type" in this case refers to the length in the depth direction of the drawings (that is, the thickness direction of the light guide plate).

In this case, the light emitting element 1 mounted on the mounting board 8 is preferably rectangular in plan view, and the frame is longer in the lengthwise direction of the light emitting element and shorter in the short-side direction to match the shape of the light emitting element. To reduce thickness, the frame may be formed so as to be thinner in the lengthwise direction than in the short-side direction.

The materials and so forth used for the each structure member of the light emitting device in this embodiment will now be described.

Mounting Board 8

The mounting board on which the light emitting element 1 is mounted is usually formed from glass epoxy, resins, ceramics (e.g., HTCC, LTCC) or another such insulating material, a composite of an insulating material and a metal member, or the like. The mounting board is preferably made of a ceramic or a thermosetting resin which have characteristics of high heat resistance and high environmental resistance. Examples of the ceramic include alumina, aluminum nitride, mullite and the like. Among them, aluminum nitride is particularly preferred due to having high heat dissipation. The mounting board may be made of ceramic combined with an insulating material such as BT resin, glass epoxy or epoxy resin. Examples of the thermosetting resin include epoxy resin, a triazine derivative epoxy resin, modified epoxy resin, silicone resin, modified silicone resin, acrylate resin and a urethane resin. Among them, a triazine derivative epoxy resin is preferred. The mounting board is preferably flat plate-like shape.

Wiring 9

The mounting board has wiring on its surface and/or in its interior, and the wiring is connected to the light emitting element. The wiring can be formed by a metal such as copper, aluminum, gold, silver, tungsten, iron and nickel, or an alloy such as iron-nickel alloy or phosphor bronze. The thickness of the wiring is, for example, in a range of a few micrometer to several hundred micrometer.

Light Emitting Element 1

For the light emitting element 1, a light emitting diode chip or another such semiconductor light emitting element can be used. The semiconductor light emitting element may include a light transmissive substrate, and a semiconductor layer formed thereon. Examples of materials used for the light transmissive substrate include a light transmissive insulating material such as sapphire ($Al_2O_3$), and a semiconductor material that transmits light emitted from the semiconductor layer (e.g., a nitride based semiconductor material).

The semiconductor stack includes multi-layer semiconductor such as an n-type semiconductor layer, a light emitting layer (active layer) and a p-type semiconductor layer. The semiconductor layer may be formed of a semiconductor such as ones of Group III-V compound semiconductor material and Group II-VI compound semiconductor material. Specifically, a nitride-based semiconductor material such as $In_XAl_YGa_{1-X-Y}N$ ($0 \leq X$, $0 \leq Y$, $X+Y \leq 1$) can be used.

The light emitting element has a pair of electrodes. The electrodes may be disposed on the same side with respect to the semiconductor laminate (i.e., the light emitting layer), or on the different side with respect to the semiconductor laminate. A good electrical conductor can be used as the electrodes of the light emitting elements, with copper or another such metal being preferable, for example.

Light Reflecting Member 2

The light reflecting member is an insulating member, and can be constituted by a light reflecting resin with a certain degree of strength. The term "light reflecting resin" means a resin whose reflectivity of the light from the light emitting element is high, for example, the reflectivity is 70% or higher.

The light reflecting resin can be obtained by dispersing a light reflecting substance in a light transmissive resin, for example. Examples of the light reflecting substances preferably include titanium oxide, silicon dioxide, zirconium dioxide, potassium titanate, alumina, aluminum nitride, boron nitride and mullite. The light reflecting substance can be in the form of particles, fibers, flakes, or the like. Among them, a fibrous material is particularly preferable because the coefficient of thermal expansion of the light reflecting member can be lowered to reduce the difference in the coefficient of thermal expansion between the light emitting elements, for example. The resin material forming the light reflecting resin is preferably made of a thermosetting light transmissive resin such as a silicone resin, silicone-modified resins, epoxy resins and a phenol resin.

Frame 4

The frame 4 can function as a reflecting member for improving the emission efficiency of the light emitting device by reflecting upward the light that is emitted to the side from the light emitting element 1 by the inner wall surfaces.

The frame preferably makes use of a material that can be applied in a liquid or a paste state on the light reflecting member 2, and hardening it as it is. In order to form the frame tall enough to serve as a dam when filled with the light transmissive member, it is preferable to be use a material in a paste state, that is, a liquid of high viscosity (e.g., in a range of 380 to 450 Pa·s of viscosity at 25° C.). Examples of such a material include thermosetting resins and thermoplastic resins such as a phenol resin, an epoxy resin, a BT resin, a PPA and a silicone resin. Also, the frame is preferably white in order to increase its reflectivity. To increase its reflectivity even more, a powder of light reflecting material (e.g., $TiO_2$, $Al_2O_3$, $ZrO_2$, MgO, ZnO) may be dispersed in the resin material before forming the frame. The power of light reflecting material herein can have a large difference in refractive index with respect to the resin used as a base material, and does not readily absorb light emitted by the light emitting element.

A height of the frame from the mounting board can be appropriately specified, but as shown in FIG. 4, it is preferably tall enough to allow the phosphor layer 14 and the diffusion layer 12 to be formed separately. A width of the frame in plan view (i.e., the thickness of the walls) can be appropriately specified as well.

Light Transmissive Member 3

The light transmissive member can employ a light transmissive resin that is commonly used in the sealing of light emitting devices in which a light emitting diode or the like is installed. More specifically, silicone resins, epoxy resins, and urea resins can be used. Also, since the previously formed frame serves as a dam, the light transmissive resin can be formed from a liquid resin material with a relatively low viscosity (e.g., in a range of 0.01 to 5.0 Pa·s of viscosity at 25° C.), which means that filling will be easy even if the area is small.

When a wavelength conversion substance, for example, a substance having a certain amount of specific gravity, such as a phosphor, is mixed into this low-viscosity resin material, since the wavelength conversion substance tends to settle before curing of the resin is completed, the wavelength conversion substance is distributed more near the surface (the top surface) of the light emitting element 1 mounted on the mounting board 8, so that light emitted by the light emitting element 1 is converted into the suitable wavelength. Also, this resin material may contain a colorant, a light diffusing material, a filler, or the like, in addition to the above-mentioned wavelength conversion substance, depending on the intended purpose and application.

The wavelength conversion substance contained in the light transmissive member will now be described.

Wavelength Conversion Substance

The wavelength conversion substance may be one at least capable of being excited by the light emitted from the light emitting element, and thereby emits light of a different wavelength. Examples thereof includes; (i) garnet-based phosphors such as aluminum-garnet-based phosphors, e.g., yttrium-aluminum-garnet (YAG)-based phosphors activated by cerium, lutetium-aluminum-garnet (LAG)-based phosphors activated by cerium, (ii) nitrogen-containing calcium aluminosilicate ($CaO$—$Al_2O_3$—$SiO_2$)-based phosphors activated by europium and/or chromium, (iii) silicate (($Sr, Ba)_2SiO_4$)-based phosphors activated by europium, (iv) β-SiAlon-based phosphors, (v) nitride-based phosphors such as CASN-based ($CaAlSiN_2$:Eu) or SCASN-based phosphors, (vi) rare earth nitride phosphors such as $LnSi_3N_{11}$-based phosphors, LnSiAlON-based phosphors (Ln is a rare earth element), (vii) oxynitride-based phosphors such as $BaSi_2O_2N_2$-based phosphors, $Ba_3Si_6O_{12}N_2$-based phosphors activated by europium, (viii) fluoride complex phosphor phosphors activated by manganese ($K_2SiF_6$:Mn), (ix) sulfide-based phosphors such as CaS-based phosphors (CaS:Eu), $SrGa_2S_4$-based phosphors ($SrGa_2S_4$:Eu), $SrAl_2O_4$-based phosphors, ZnS-based phosphors, and (x) chloro-silicate-based phosphors, and the like.

Examples of the phosphor may include a luminescent material referred to as a so called nanocrystal or quantum dot, which each is nano-size high-dispersive particles of semiconductor materials, for example Group II-VI, Group III-V and Group IV-VI semiconductors, more specifically CdSe, core-shell type $CdS_xSe_{1-x}$/ZnS, GaP, InP, and GaAs. The quantum dot phosphor may be unstable, and therefore may be surface-covered or stabilized with a resin such as PMMA (polymethyl methacrylate), a silicone resin, an epoxy resin, a hybrid resin of these, and the like.

Underfill

Underfill preferably has a coefficient of thermal expansion which is between that of the light reflecting member 2 and the light emitting element 1. Particularly, the coefficient of thermal expansion of the underfill is preferably closer to that of the light emitting element 1 than that of the light reflecting member 2.

The underfill contains a filler so that a coefficient of thermal expansion can be made to approach a coefficient of thermal expansion of the light emitting element 1. The material of the underfill is appropriately selected in particular as long as it is less likely to absorb light from the light emitting element. For example, the material includes an epoxy resin, a silicone resin, a modified-silicone resin, a urethane resin, an oxetane resin, an acrylic material, a polycarbonate resin, and a polyimide resin.

In the case where the underfill contains the white filler, the light is more likely to be reflected, and the light extraction efficiency can be improved. For a material of the filler, inorganic compound is preferably used. Here, the "white filler" includes one which looks white when scattered due to a difference in refractive index from a material around the filler even when the filler is transparent itself.

Support Member 24

The support member is removed after the light emitting element 1 is mounted in place and at least after the light reflecting member 2 has been formed. Accordingly, the light emitting device can be more compact. The material can be appropriately selected, and the support member may be in a sheet-like or a plate-like shape.

Sealing Member 5

Examples of the light transmissive member forming the sealing member include a thermosetting resin such as a silicone resin, a silicone-modified resin, an epoxy resin, a phenol resin, and a thermoplastic resins such as a polycarbonate resin, an acrylic resin, a methylpentene resin, a polynorbomene resin. Among them, a silicone resin is particularly preferable as the light transmissive member due to having good resistance to light and environment.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
   a light emitting element having a top surface and a lateral surface;
   a light reflecting member that is disposed so as to cover the lateral surface of the light emitting element and expose the top surface of the light emitting element;
   a frame that is disposed on the light reflecting member so as to surround an outer periphery of the top surface of the light emitting element;
   a light transmissive member that is light transmissive and disposed inside the frame; and
   a sealing member that covers the light reflecting member, the frame and the light transmissive member, the sealing member having a curved portion and a flange arranged in an outer periphery of the curved portion with a top surface of the curved portion being positioned higher than a top surface of the flange, wherein the flange covers part of the frame.

2. The light emitting device according to claim 1, wherein the light transmissive member contains a wavelength conversion substance.

3. The light emitting device according to claim 2, wherein the wavelength conversion substance is settled on the light emitting element side in the light transmissive member.

4. The light emitting device according to claim 1, wherein the top surface of the light emitting element is substantially flush with a top surface of the light reflecting member.

5. The light emitting device according to claim 1, further comprising
   a protective element that is embedded in the light reflecting member.

6. The light emitting device according to claim 1, wherein a plurality of light emitting elements are mounted on a top surface of the mounting board, and spacing between the adjacent light emitting elements is in a range of 1 μm to 300 μm.

7. The light emitting device according to claim 1, further comprising
   a mounting board having terminal electrodes on a lower surface of the mounting board,
   wherein the light emitting element is mounted on a top surface of the mounting board.

8. The light emitting device according to claim 1, wherein the light transmissive member contains a light diffusing material.

9. The light emitting device according to claim 1, wherein the light reflecting member is in contact with the lateral surface of the light emitting element.

10. A light emitting device comprising:
    a light emitting element having a top surface and a lateral surface;
    a light reflecting member that is disposed so as to cover the lateral surface of the light emitting element and expose the top surface of the light emitting element;
    a frame that is disposed on the light reflecting member so as to surround an outer periphery of the top surface of the light emitting element;
    a light transmissive member that is light transmissive and disposed inside the frame; and
    a sealing member that covers the light reflecting member, the frame and the light transmissive member, the sealing member also having a flange wherein the flange covers part of the frame, wherein
    the light emitting element has a semiconductor layer and a pair of electrodes disposed on a same side of the semiconductor layer, and
    the pair of electrodes are exposed from a lower surface of the light reflecting member.

11. The light emitting device according to claim 10, wherein
    the top surface of the light emitting element is substantially flush with a top surface of the light reflecting member.

12. The light emitting device according to claim 10, further comprising
    a protective element that is embedded in the light reflecting member.

13. The light emitting device according to claim 10, further comprising
    a mounting board having terminal electrodes on a lower surface of the mounting board,
    wherein the light emitting element is mounted on a top surface of the mounting board.

14. The light emitting device according to claim 10, wherein
    the light reflecting member is in contact with the lateral surface of the light emitting element.

15. A light emitting device comprising:
    a light emitting element having a top surface and a lateral surface;
    a light reflecting member that is disposed so as to cover the lateral surface of the light emitting element and expose the top surface of the light emitting element;
    a frame that is disposed on the light reflecting member so as to surround an outer periphery of the top surface of the light emitting element;
    a light transmissive member that is light transmissive and disposed inside the frame with an outer perimeter of the light transmissive member being defined by the frame; and
    a sealing member that covers the light reflecting member, the frame and the light transmissive member, the sealing member having a flange wherein the flange covers part of the frame.

16. The light emitting device according to claim 15, wherein
    the top surface of the light emitting element is substantially flush with a top surface of the light reflecting member.

17. The light emitting device according to claim 15, further comprising
    a protective element that is embedded in the light reflecting member.

18. The light emitting device according to claim 15, further comprising
    a mounting board having terminal electrodes on a lower surface of the mounting board, wherein the light emitting element is mounted on a top surface of the mounting board.

19. The light emitting device according to claim 15, wherein the light reflecting member is in contact with the lateral surface of the light emitting element.

* * * * *